United States Patent
Asam (12) 
(10) Patent No.: US 11,137,471 B2
(45) Date of Patent: Oct. 5, 2021

(54) CURRENT MEASUREMENT DEVICE, CURRENT MEASUREMENT METHOD AND CALIBRATION METHOD

(71) Applicant: Infineon Technologies AG, Neubiberg (DE)

(72) Inventor: Michael Asam, Inchenhofen-Sainbach (DE)

(73) Assignee: Infineon Technologies AG, Neubiberg (DE)

( * ) Notice: Subject to any disclaimer, the term of this patent is extended or adjusted under 35 U.S.C. 154(b) by 15 days.

(21) Appl. No.: 16/743,996

(22) Filed: Jan. 15, 2020

(65) Prior Publication Data
US 2020/0233054 A1    Jul. 23, 2020

(30) Foreign Application Priority Data
Jan. 21, 2019   (DE) .......................... 102019101408.5

(51) Int. Cl.
*G01R 35/00* (2006.01)
*G01R 19/32* (2006.01)

(52) U.S. Cl.
CPC .......... *G01R 35/005* (2013.01); *G01R 19/32* (2013.01)

(58) Field of Classification Search
None
See application file for complete search history.

(56) References Cited

U.S. PATENT DOCUMENTS

| 2003/0155930 A1* | 8/2003 | Thomsen | G01R 19/0092 324/522 |
| 2016/0077135 A1 | 3/2016 | Jockel et al. | |
| 2020/0386788 A1* | 12/2020 | Cho | G01R 1/203 |

FOREIGN PATENT DOCUMENTS

| DE | 102004062655 A1 | 7/2006 |
| DE | 102006007741 A1 | 8/2007 |
| DE | 102009044992 A1 | 4/2011 |
| DE | 102014218708 A1 | 3/2016 |

OTHER PUBLICATIONS

Office Action, in the German language, from counterpart German Application No. 102019101408.5, dated Oct. 2, 2019, 10 pp.

* cited by examiner

*Primary Examiner* — Jas A Sanghera
(74) *Attorney, Agent, or Firm* — Shumaker & Sieffert, P.A.

(57) ABSTRACT

Current measurement device and methods are provided. An output signal is provided based on a voltage across a resistive element. A correction circuit is configured to estimate an indication of a temperature change of the resistive element based on the voltage across the resistive element and to correct the output of the current measurement device based on the indication of the temperature change and a measured temperature.

20 Claims, 6 Drawing Sheets

CURRENT MEASUREMENT DEVICE, CURRENT MEASUREMENT METHOD AND CALIBRATION METHOD

This Application claims priority to German Application 102019101408.5, filed on Jan. 21, 2019, the entire content of which is incorporated herein by reference.

TECHNICAL FIELD

The present application relates to current measurement devices, current measurement methods and calibration methods for such current measurement devices.

BACKGROUND

In various applications, currents need to be measured. For example, in vehicle power networks of modern vehicles, high currents of the order of several hundreds Amperes may be flowing, which are often switched using power MOSFETs (metal oxide semiconductor field effect transistors). In such and other applications, a precise measurement of the current may be required to determine a degree of utilization of the power network and to protect components like a battery, power lines and loads against overcurrents. For example, electrical fuses may be used where an electrical connection is interrupted using for example a MOSFET switch in case of an overcurrent.

In case of such high currents, currents may be measured using a shunt resistor. The current to be measured flows through the shunt resistor, and a voltage across the shunt resistor is measured to determine the current.

However, the current flowing through the shunt resistor may heat the shunt resistor. This applies in particular to high-current applications. To allow precise measurements, in conventional solutions, special shunt resistors are used which have an essentially constant resistance over a temperature range of interest. Such temperature constant shunt resistors are relatively costly.

On the other hand, if, for example, a simple copper clip were used as a shunt resistor, a high temperature dependence of the resistance and, therefore, of the voltage across the shunt resistor would result. For example, in the case of copper, for a temperature difference of about 5K, the resistance may change by about 2%. For a temperature range between −40° C. and 125° C., which may be a temperature range required, for example, for an automotive application, the overall variation in resistance depending on the temperature may be almost a factor of two from the lowest to the highest temperature.

SUMMARY

A current measurement device as defined in claim 1, a current measurement method as defined in claim 10 and a calibration method as defined in claim 17 are provided. The dependent claims define further embodiments.

According to an embodiment, a current measurement device is provided, comprising:

a voltage measurement circuit configured to measure a voltage across a resistive element, and a correction circuit configured to:

generate an output signal indicative of a current through the resistive element based on the voltage across the resistive element, estimate an indication of a temperature change of the resistive element based on the voltage across the resistive element, and correct the output signal indicative of the current through the resistive element based on the indication of the temperature change and a measured temperature of the resistive element.

According to another embodiment, a current measurement method is provided, comprising:

measuring a voltage across a resistive element, generating an output signal indicative of a current through the resistive element based on the voltage across the resistive element, measuring a temperature of the resistive element, estimating an indication of a temperature change of the resistive element based on the voltage across the resistive element, and correcting the output signal based on the indication of the temperature change and the measured temperature of the resistive element.

According to another embodiment, a method for calibrating the current measurement device as mentioned above is provided, comprising:

applying a current pulse to the resistive element of the current measurement device, measuring a first temperature and a first voltage across the resistive element at a beginning of the current pulse, measuring a second temperature and a second voltage before the end of the current pulse, and determining a temperature dependence of a resistance of the resistive element based on the first temperature, the first voltage, the second temperature and the second voltage.

The above summary is merely intended to give a brief overview over some embodiments and is not to be construed as limiting. Other embodiments may comprise other features that the ones explained above.

DETAILED DESCRIPTION

In the following, various embodiments will be described referring to the attached drawings. These embodiments are taken to be as illustrative examples only and are not to be construed as limiting.

Apart from the features and components explicitly shown and described, other features or components, for example features or components used in conventional current measurement devices, may be provided. Features or components from different embodiments may be combined to form further embodiments. Variations and modifications described with respect to one of the embodiments may also be applied to other embodiments and will therefore not be described repeatedly.

Connections or couplings described in the following refer to electrical connections or couplings unless they are explicitly described as thermal connections or couplings. Such electrical connections or couplings may be modified as long as the general purpose of the connection or coupling, for example to transmit a certain kind of signal or to transmit a certain kind of information, is essentially maintained.

Throughout the figures, like elements are designated with the same reference numerals and will therefore not be described repeatedly.

Figure 1:
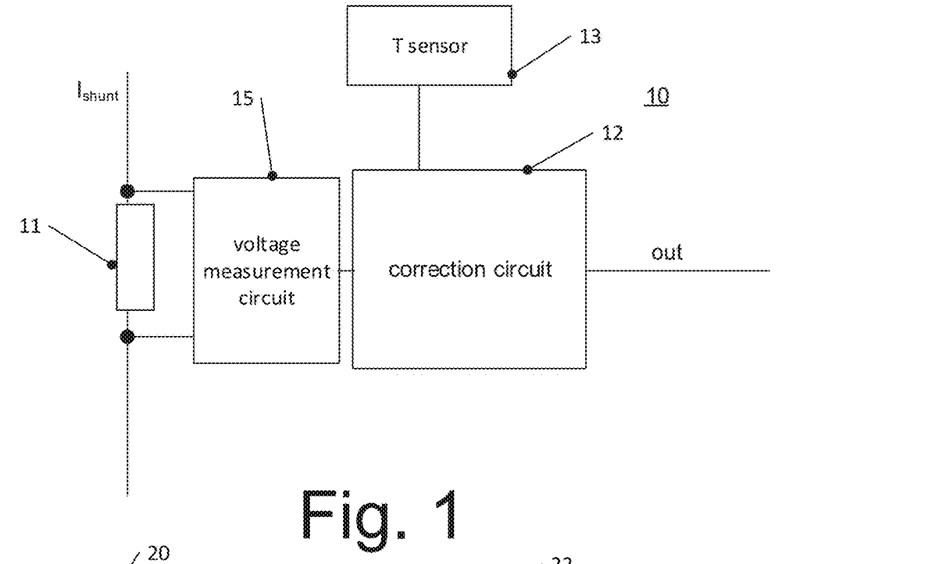
FIG. 1 is a block diagram of a temperature measurement device according to an embodiment.

FIG. 1 shows a block diagram of a current measurement device 10 according to an embodiment. Device 10 comprises a resistive element 11, a correction circuit 12, a voltage measurement circuit 15 and a temperature sensor 13. A current $I_{shunt}$ to be measured flows through resistive element 11, causing a voltage drop across resistive element 11. Resistive element 11 may, in some embodiments, be a shunt resistor formed by a metal lead or a metal clip like a copper clip, but is not limited thereto. For example, resistive element 11 may also comprise a MOSFET transistor, and the on-resistance $R_{ON}$ of the MOSFET transistor forms the resistance of resistive element 11. Generally, any resistive element 11 with a well-defined relationship between the current $I_{shunt}$ and a voltage drop across resistive element 11 may be used.

Resistive element 11 has a temperature dependent resistance. For example, in case of a shunt resistor made of copper, the specific resistance essentially changes linearly over temperature. Generally, for resistive elements made of a metal, the temperature dependence of the resistance is essentially linear over temperature ranges of interest and in any case may be measured.

Voltage measurement circuit 15 measures the voltage across resistive element 11 and provides it to correction circuit 12. For example, voltage measurement circuit 12 may comprise an analog-to-digital converter to provide the voltage across resistive element 11 in digitized form. Correction circuit 12 generates an output signal out indicative of the current $I_{shunt}$ based on the measurement. This output signal out is corrected to take the temperature dependence of the resistance of resistive element 11 into account.

To this end, correction circuit 12 receives an input from temperature sensor 13. Temperature sensor 13 is thermally coupled to resistive element 11, such that temperature changes of resistive element 11 are reflected in the temperature measured by temperature sensor 13.

This allows for what will be referred to as "static" correction herein. In other words, as the temperature dependence of the resistance of resistive element 11 is known, by measuring the temperature by temperature sensor 13, the output signal out may be corrected.

However, as will be explained in some more detail in the following, the temperature measured by temperature sensor 13 follows the temperature of resistive element 11 in a delayed manner, such that, for example, a temperature rise of resistive element 11 is reflected in the measured temperature only with a time delay. Typical time constants of such a delay may be of the order of 3 to 10 seconds. For example, temperature sensor 13 may be located at some distance to resistive element 11, for example, up to 10 cm, which leads to such delays. This corresponds to a low-pass behavior of the temperature sensor.

On the other hand, for example, in case of short circuits or other overcurrent events, $I_{shunt}$ may rise rapidly, which may lead to a rapid increase in temperature of resistive element 11. Such rapid changes of the temperature of resistive element 11 are reflected in the temperature measured by temperature sensor 13 only with a delay, as explained above.

In embodiments, therefore, correction circuit 12 estimates an indication of a temperature change of resistive element 11 based on the voltage across resistive element 11 (i.e. a value that reflects a temperature change) and corrects the output signal out both based on the temperature measurement by temperature sensor 13 and the indication of the temperature change. In some embodiments, this allows more precise current measurements, also in case of a rapid increase of the temperature of resistive element 11 due to rapidly rising currents. Embodiments of such an estimation of the indication of the temperature change will also be explained below in more detail, where the estimation if performed using a calculation based on a thermal model.

The compensation of such comparatively rapid temperature increases using the indication of the temperature change is also referred to as "dynamic" correction herein.

Figure 2:
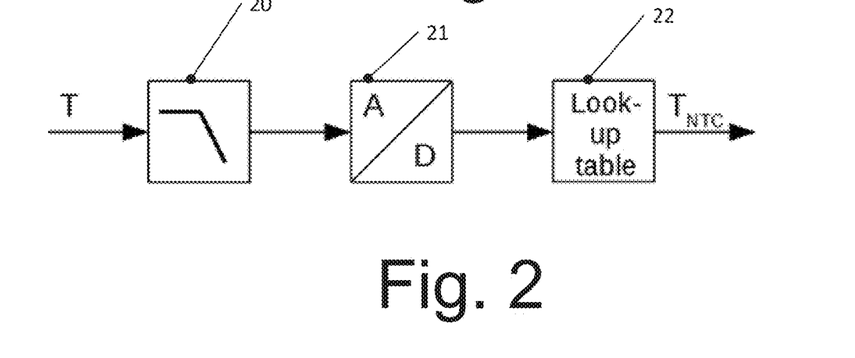
FIG. 2 is a block diagram illustrating a static temperature measurement.

FIG. 2 illustrates the above-mentioned temperature measurement. A temperature sensor 20, which may correspond to temperature sensor 13 of FIG. 1, measures a temperature T. In the embodiment of FIG. 2, temperature sensor 20 is a negative temperature coefficient (NTC)-based temperature sensor. It should be noted that, instead of an NTC-based element, other conventional temperature sensors may be used, for example a diode, a sensor sensing a thermal voltage on a metal junction, a PTAT (proportional to absolute temperature) current sensor or any other conventional temperature sensor. Such temperature sensors in many cases are provided in a system for other purposes, for example to provide over temperature protection. Temperature sensor 20 has a low-pass behavior, as explained above, which essentially means that temperature changes of a resistive element like resistive element 11 are measured only with a time delay. This time delay may be caused by the thermal coupling between resistive element 11 and temperature sensor 20, via a circuit board or other elements, and/or by a thermal inertia of the temperature sensor itself. For example, a mass of the temperature sensor, even if small, takes some time to be heated, and heat takes time to flow from the resistive element to the temperature sensor. Typical time constants of this low-pass filter behavior may be in the range of 3 to 10 seconds. This corresponds to corner frequencies of the low-pass filter behavior of $1/(2\pi 10)$ Hz to $1/(2\pi 3)$ Hz, as the corner frequency $f=1/(2\pi\tau)$, where $\tau$ is the time constant. These values are only examples and may vary depending on the type of temperature sensor and the thermal coupling between resistive element and temperature sensor.

An output signal of temperature sensor 20, usually an output voltage, is digitized by an analog-to-digital converter 21.

Analog-to-digital converter 21 may be part of correction circuit 12 of FIG. 1. Using a lookup table 22, the resulting digital value is converted to a measured temperature $T_{NTC}$. The lookup table 21 essentially reflects the calibration of temperature sensor 20, i.e. translates its output signal to absolute temperatures.

Next, an estimation of an indication of a temperature change will be explained referring to FIGS. 3A, 3B and 4.

Figure 3A:
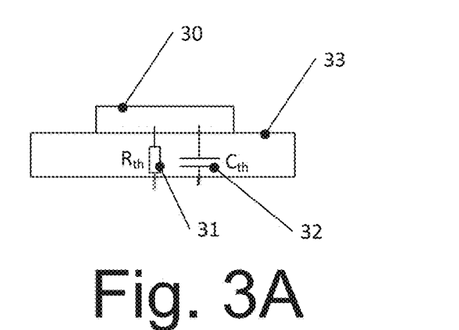
FIG. 3A is a diagram illustrating a simple thermal model of a shunt resistor.

FIG. 3A illustrates a simple thermal model of a resistive element 30 mounted on a circuit board 33, e.g. a printed circuit board. Circuit board 33 and other components like leads on circuit board 33 have a thermal resistance 31 with a resistance value $R_{th}$ and a thermal capacitance 32 with a capacitance value $C_{th}$. Thermal capacitance 32 essentially represents the thermal capacity of circuit board 33 and other components like leads, and thermal resistance 31 essentially represents the inverse of the thermal conductivity of circuit board 33 and those other components. Together, they determine how fast heat can be thermally conducted away from resistive element 30. Resistive element 30 in the example of FIG. 3A may for example be a shunt resistor implemented as a copper lead on the circuit board.

Figure 3B:
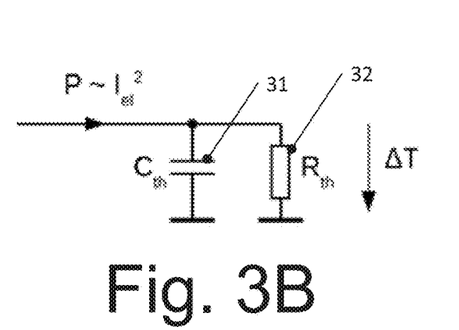
FIG. 3B is a corresponding equivalent thermal circuit.

FIG. 3B shows a thermal equivalent circuit of the arrangement of FIG. 3A. Therefore, it is to be understood that the circuit of FIG. 3B is not an electrical circuit, but a person skilled in the art will understand that thermal circuits may be represented in a manner similar to electrical circuits, and its behavior may be modeled by a corresponding electrical circuit.

The thermal circuit of FIG. 3B receives the dissipated power P in the resistive element as an input value. This dissipated power is proportional to the electric current $I^2_{el}$ (corresponding to $I_{shunt}$ of FIG. 1) flowing through resistive element 30, and is, therefore, proportional to the squared voltage across resistive element 30. Ground in FIG. 3B represents the environment temperature, which may then be the temperature measured by a temperature sensor like temperature sensor 13 of FIG. 1 or temperature sensor 20 of FIG. 2. ΔT is the difference between the temperature of the resistive element and the temperature of the environment, corresponding to a voltage drop in an electrical circuit.

Thermal resistance 31 and thermal capacitance 32 represent a first order low-pass filter. This first order low-pass filter may be implemented in correction circuit 12 of FIG. 1 to estimate ΔT as an indication of the temperature change.

As the capacitance value $C_{th}$ and the resistance value $R_{th}$ are comparatively large (for example capacitance values up to the nF or even mF range), in embodiments, a digital implementation of the first order low-pass filter is used to estimate ΔT. Nevertheless, in other embodiments, the behavior of the thermal circuit of FIG. 3B may also be replicated by an analog electrical circuit using corresponding capacitors and resistors.

Figure 4:
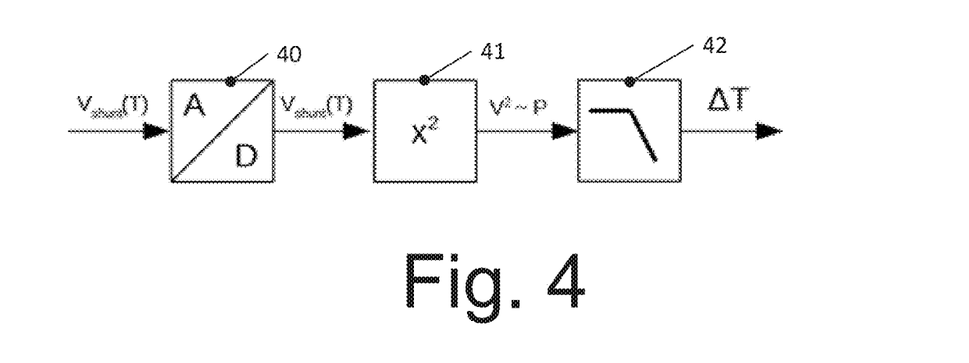
FIG. 4 is a block diagram of a circuit illustrating a temperature change estimation according to some embodiments.

FIG. 4 shows a block diagram of an implementation example of a circuit for estimating ΔT according to some embodiments. The temperature dependent voltage $V_{shunt}(T)$ across a resistive element like resistive element 11 of FIG. 1 is digitized by an analog-to-digital converter 40. The digitized voltage is squared at block 41. As already mentioned, the squared voltage is proportional to the dissipated power P in the resistive element. This squared voltage is then low-pass filtered by a low-pass filter 42 reflecting the behavior of thermal low-pass filter formed by thermal capacitance 31 and thermal resistance 32 in FIG. 3B. The corner frequency of low-pass filter 42 and the gain of low-pass filter 42, which input may correspond to the proportionality factor between P and the squared voltage, may be determined by calibration.

Implementation examples of such a calibration will be described later referring to FIGS. 12 and 13.

It should be noted that while a simple first order model is used in FIGS. 3A and 3B resulting in first order low-pass filter 42, in other embodiments also higher order models may be used resulting in higher order low-pass filters. Such higher order models may model thermal networks both for the resistive element and for the thermal coupling between resistive element or temperature sensors and may use more thermal resistors and more thermal capacitors as shown in FIGS. 3A and 3B. This may in some implementations increase accuracy in case of largely different thermal time constants occur in the device.

Furthermore, instead of simply squaring the voltage, also a higher order polynomial of the voltage may be used to take non-linearities like heat radiation into account, which increases the precision of the model. The choice of the model may depend on a precision needed for the current measurement, as it may influence the accuracy of the estimation of ΔT. The term "estimation" as used herein therefore reflects the fact that depending on the thermal model used for calculating ΔT, the accuracy may vary.

The thus obtained indication of the temperature change ΔT may then be combined with the measured temperature $T_{NTC}$ as illustrated in FIG. 2 to obtain an estimate $T_{shunt}$ of the actual temperature of the resistive element. An example for such a combination is shown in FIG. 5.

Figure 5:
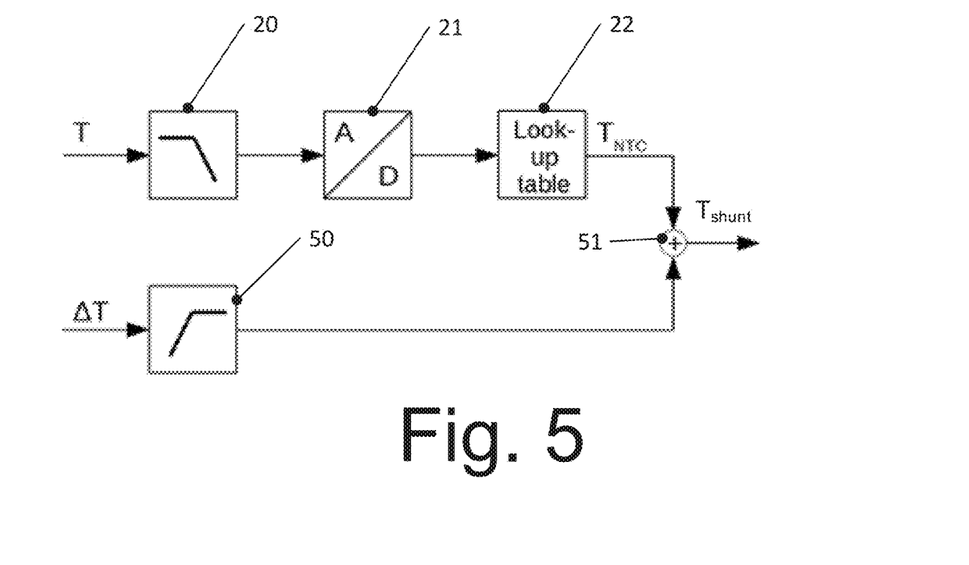
FIG. 5 is a block diagram of a circuit according to an embodiment illustrating combining a temperature measurement with a temperature change estimation.

The circuit of FIG. 5 includes the circuit of FIG. 2 with elements 20 to 22 to provide the temperature $T_{NTC}$ based on the measured temperature T. Furthermore, the circuit of FIG. 5 receives the indication ΔT as generated for example by the circuit of FIG. 4. ΔT is filtered by a digital high-pass filter 50. Digital high-pass filter 50 has a corner frequency corresponding the corner frequency of the low-pass behavior of temperature sensor 20 in some embodiments. This essentially ensures that ΔT filtered by high-pass filter 50 represents a dynamic temperature change of the resistive element which is not captured by temperature sensor 20 due to the low-pass behavior, and ensures that there are no components of the overall temperature which are "measured twice". The output of high-pass filter 50 is then added to $T_{NTC}$ at an adder 51 to provide an estimated actual temperature $T_{shunt}$ of the resistive element. It should be noted that high-pass filter 50 may be a first order or higher order high-pass filter.

Figure 6:
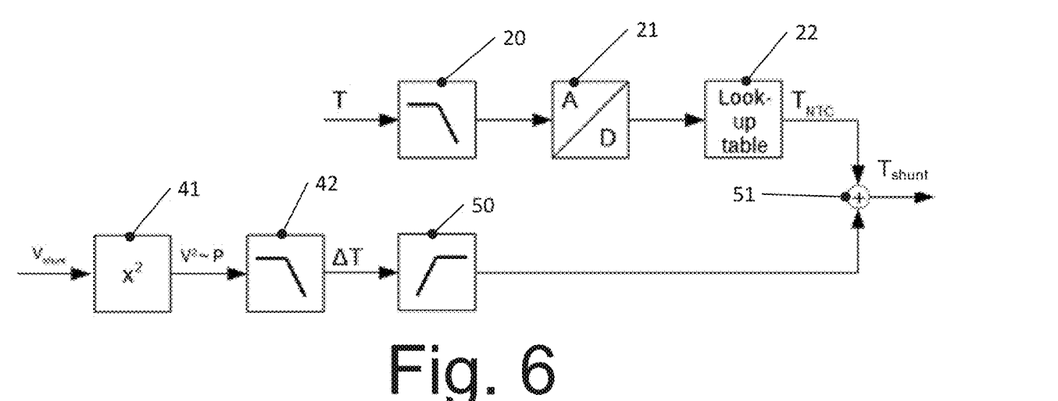
FIGS. 6 and 7 are block diagrams illustrating circuits for determining a temperature of a resistive element according to some embodiments.

FIG. 6 is a block diagram of a circuit according to an embodiment to determine an estimation of the actual temperature $T_{shunt}$ of the resistive element, which corresponds to the components discussed with respect to previous figures added together. As can be seen, the path 41, 42, 50, which provides the dynamic component, comprises low-pass filter 42 and high-pass filter 50.

Figure 7:
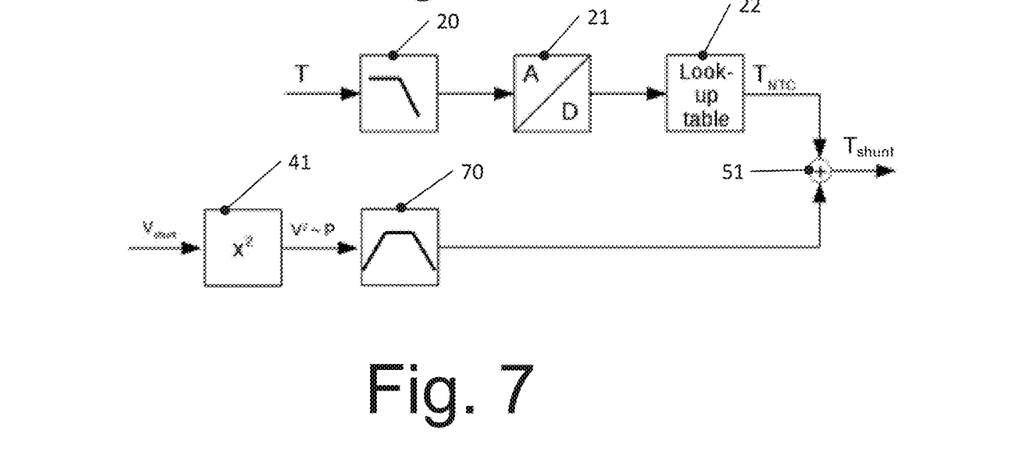

As shown in FIG. 7, these two filters 42, 50 may be combined to a band-pass filter 70. A lower corner frequency of this band-pass filter corresponds to the corner frequency of high-pass filter 50 and therefore to the corner frequency of the low-pass behavior of the temperature measurement by temperature sensor 20, and an upper corner frequency of band-pass filter 70 corresponds to the corner frequency of low-pass filter 42, which represents the low-pass behavior of the thermal circuit illustrated with respect to FIGS. 3A and 3B.

Based on this actual temperature of the $T_{shunt}$ of the shunt, the voltage across the resistive element may be corrected to correspond to a voltage at a nominal resistance $R_{nom}$ of the resistive element, thus providing an essentially temperature independent current measurement. Corresponding embodiments will be described referring to FIGS. 8 and 9. Again, component already described with respect to previous embodiments bear the same reference numeral and will not be described again in detail.

Figure 8:
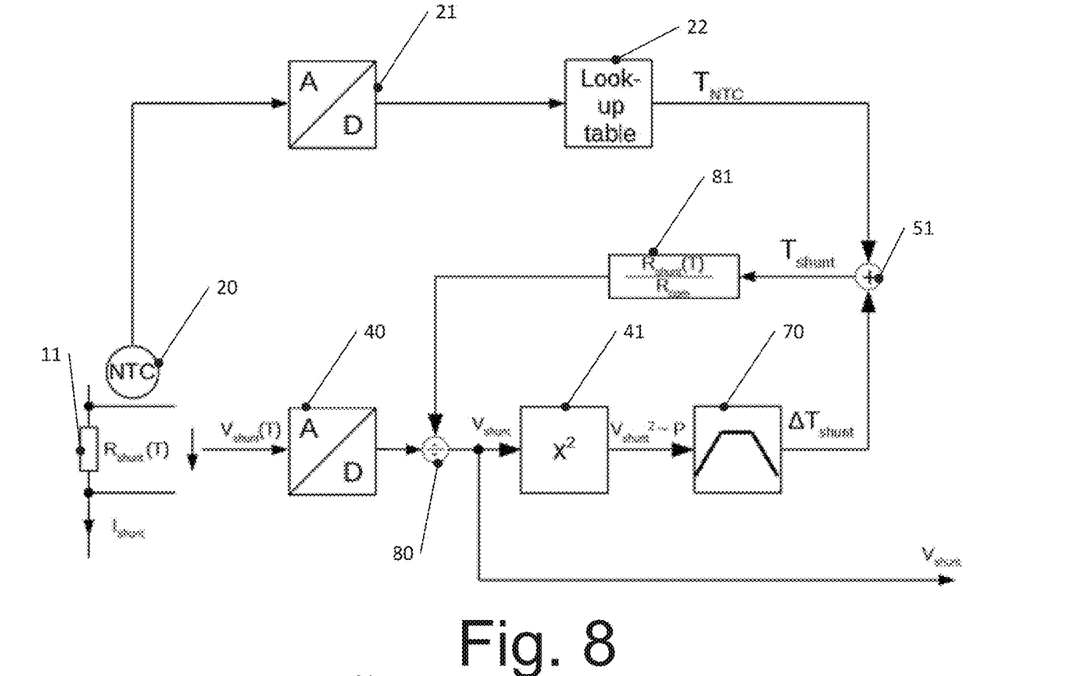
FIGS. 8 and 9 are block diagrams of temperature measurement devices according to some embodiments.

In FIG. 8, the estimated actual temperature $T_{shunt}$ of resistive element 11 is determined as discussed previously. Based on this temperature, in a block 81 a correction factor is determined based on a ratio between the resistance $R_{shunt}$(T) at the actual temperature $T_{shunt}$ and a nominal resistance $R_{nom}$ of the shunt. This ratio may be calculated in case of a resistive element 11 which for example has a simple linear resistance or, in case of other dependencies of the resistance of resistive element 11 from temperature, may be obtained based on a calibration curve of resistive element 11. An example calibration of block 81 will be discussed later referring to FIGS. 12 and 13.

The correction factor is then applied to the output of analog-to-digital converter 40, i.e. to the digital voltage $V_{shunt}(T)$, to provide a temperature compensated voltage $V_{shunt}$. This temperature compensated voltage is then used both for the estimation of the indication of the temperature change and as an output signal $V_{shunt}$ representative of the current $I_{shunt}$ through resistive element 11 in FIG. 8.

Figure 9:
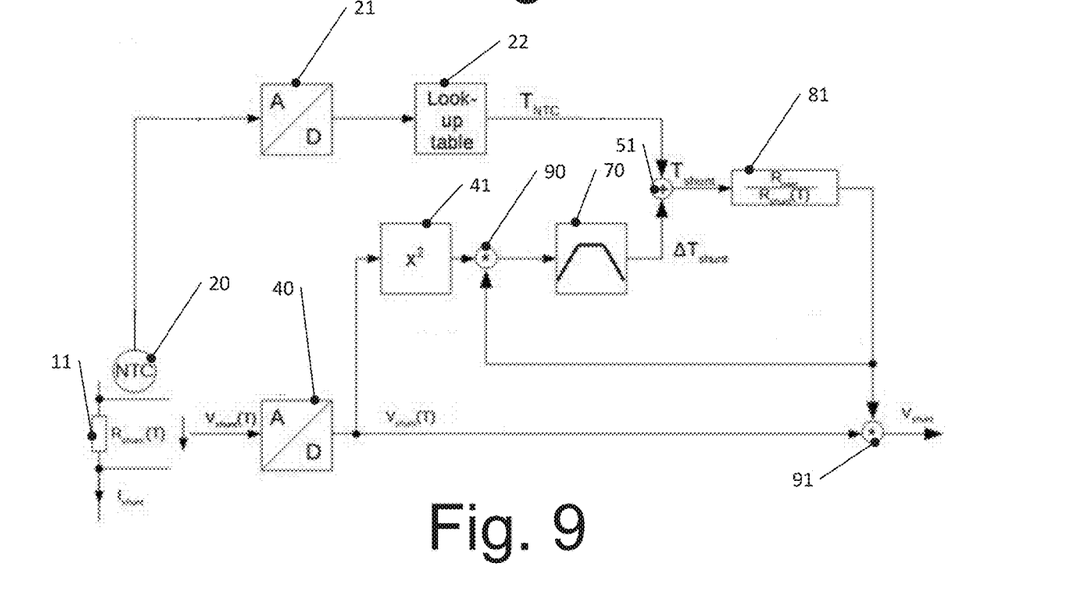

FIG. 9 is a variation of the embodiment of FIG. 8. Here, the correction factor from block 81 is applied on the one hand to the output signal of analog-to-digital converter 40 at 91 to provide the corrected output signal $V_{shunt}$, and at the input of band-pass filter 70 at 90. In other words, in this case the temperature dependent voltage $V_{shunt}(T)$ is squared at 41, and only after this the temperature compensation is applied. As will be discussed later when discussing the calibration, this approach may increase the accuracy of the correction in some embodiments.

It should be noted that element 80 in FIG. 8 is represented as a divider, while elements 90, 91 in FIG. 9 are represented as multipliers. This depends on how the correction factor is formed at block 81. Dividers are used if the correction factor essentially is $R_{shunt}(T)/R_{nom}$, and multipliers may be used if the correction factor is the inverse thereof, i.e. $R_{nom}/R_{shunt}(T)$. Both variations may be used in embodiments.

It should further be noted that FIGS. 8 and 9 comprise two analog-to-digital converters 21, 40. In other embodiments, a single analog-to-digital converter may be used together with a multiplexer. In this way, for example in an alternating manner the output value of temperature sensor 20 and the voltage across resistive element 11 may be digitized. Any suitable analog-to-digital converters may be used.

The various digital components discussed above which process the digital signals may be implemented in various manners. For example, they may be implemented in a logic circuit which is part of an integrated circuit also used for other tasks like controlling a MOSFET switch and therefore containing gate drivers, other types of controllers, monolithic switches as well as be implemented in microcontrollers by programming the microcontrollers accordingly, be implemented using field programmable gate arrays or any other conventional approaches for processing digital signals.

Figure 10:
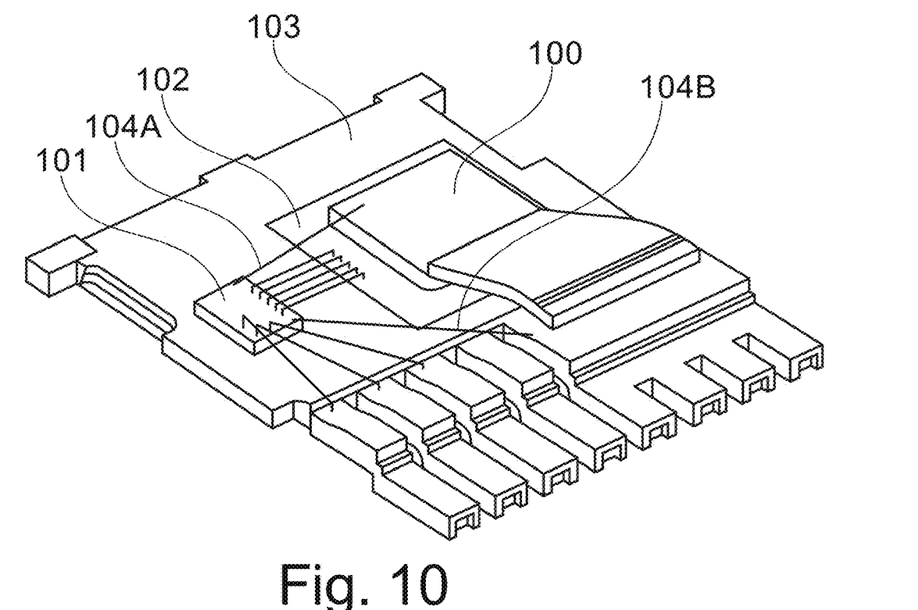
FIG. 10 is a perspective view of a system according to an embodiment.

FIG. 10 shows an implementation example of a system using a current measurement device according to an embodiment.

FIG. 10 illustrates a MOSFET chip 102 mounted on a carrier 103, for example a printed circuit board (PCB) or a lead frame. One terminal of MOSFET chip 102 is coupled to a metal clip 100 to conduct current. The terminal may for example be the source terminal or the drain terminal of MOSFET chip 102.

A control chip 101 controls MOSFET chip 102. Control chip 101 for example may comprise gate drivers to control switching of MOSFET chip 102.

In addition, control chip 101 comprises circuitry to implement a current measurement according to techniques as discussed above. Metal clip 100 serves as resistive element and is coupled to control chip 101 via two bond wires 104A, 104B to provide the voltage across metal clip 100 to control chip 101. Control chip 101 additionally comprises a temperature sensor as discussed above. The temperature measurement by control chip 101 has the already discussed low-pass filter behavior at least in part because of the spatial distance between control chip 101 and metal clip 100, such that temperature changes of metal clip 100 are reflected in the temperature measurement by control chip 101 in a delayed manner.

Control chip 101 then implements a circuit as discussed above for correcting the current measurement represented by the voltage across metal clip 100 based on the temperature and an estimated indication of a temperature change based on the voltage, as discussed above. It should be noted that FIG. 10 merely shows one implementation and application example, and techniques discussed herein may be used for current measurements in various applications and implementations.

Figure 11:
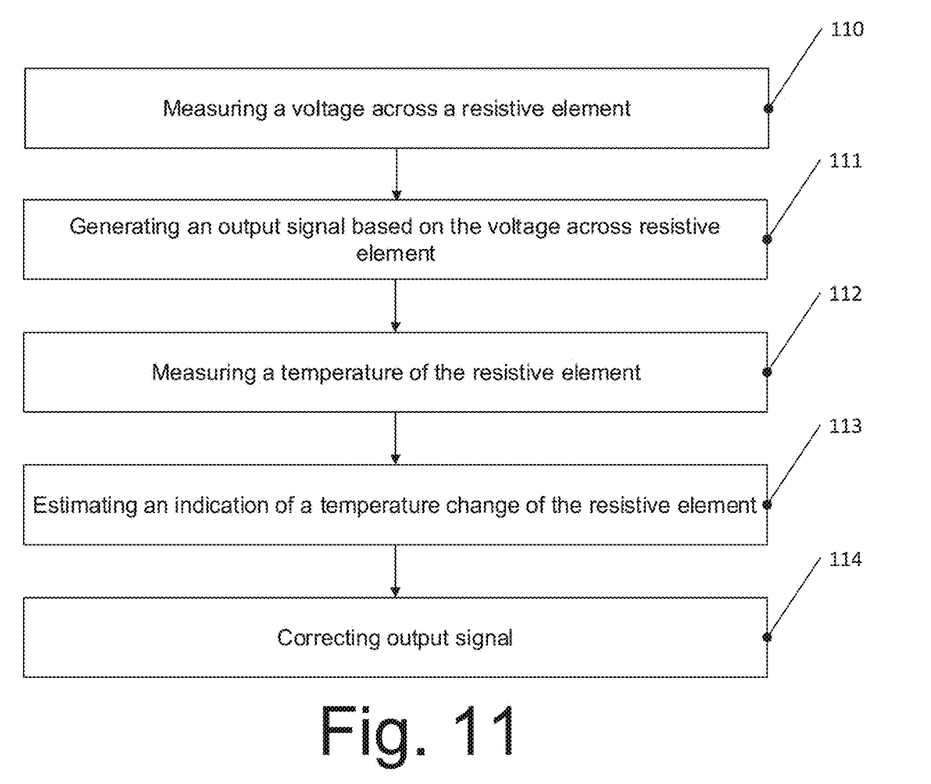
FIG. 11 is a flow chart illustrating a temperature measurement method according to an embodiment.

FIG. 11 is a flow chart illustrating a current measurement method according to some embodiments. The method of FIG. 11 may be implemented using devices and circuits as discussed above, but is not restricted thereto. In order to avoid repetitions, nevertheless the method of FIG. 11 will be described referring to the explanations previously made referring to FIGS. 1 to 10.

It should be noted that while the method is represented as a series of acts or events, the order in which the acts or events are described is not to be construed as limiting. In particular, various acts or events may be performed simultaneously.

At 110, the method comprises measuring a voltage across a resistive element. The resistive element may for example be resistive element 11 or 30 as discussed above.

At 111, the method comprises generating an output based on the voltage across the resistive element measured at 110. In some embodiments, the output may be the voltage itself. In other embodiments, the voltage may be converted to a current by dividing it by a nominal resistance of the resistive element.

At 112, the method comprises measuring a temperature which is related to a temperature of the resistive element by a low-pass filter behavior. In particular, as explained previously, the temperature may be measured by a temperature sensor like temperature sensor 13 or 20, which is thermally coupled to the resistive element and which has a low-pass behavior for the reasons discussed above.

At 113, the method comprises estimating an indication of a temperature change of the resistive element based on the voltage across the resistive element measured at 110, for example based on a square of the voltage or other polynomial as discussed above.

At 114, the method then comprises correcting the output based on the measured temperature and the estimated indication, for example as explained above with reference to FIGS. 8 and 9.

Next, calibration of the previously discussed current measurement devices will be explained. The calibration may be divided in a "static" part, which essentially determines the parameters for block 81 in FIGS. 8 and 9, and a dynamic calibration, which essentially determines parameters of band-pass filter 70 of FIGS. 8 and 9 (or of low-pass filter 42 and high-pass filter 50 of FIG. 6 in case separate filters are used). FIG. 12 is a flow chart illustrating a calibration method according to an embodiment. Before turning to FIG. 12, some background for the calibration will be explained.

The temperature dependent resistance $R_{shunt}(T)$ may at least be approximated by the following equation:

$$T_{shunt}(T) = R_{shunt}(T_{ref}) \cdot [1 + \alpha \cdot (T - T_{ref})] \quad (1)$$

In this equation, $T_{ref}$ is a reference temperature, $\alpha$ is a temperature coefficient of the resistive element, and $R_{shunt}(T_{ref})$ is the resistance value of the resistive element at the reference temperature $T_{ref}$.

For block 81 of FIGS. 8 and 9 therefore the following relationship applies:

$$\frac{R_{shunt}(T)}{R_{nom}} = \frac{R_{shunt}(T_{ref})}{R_{nom}}\{1 + \alpha \cdot (T - T_{ref})\} \quad (2)$$

$R_{nom}$ as mentioned is the nominal shunt resistance, which for example is used to calculate the current from the (corrected) voltage. For the calibration, the values $R_{shunt}(T_{ref})$, $T_{ref}$ and $\alpha$ have to be determined.

Figure 12:
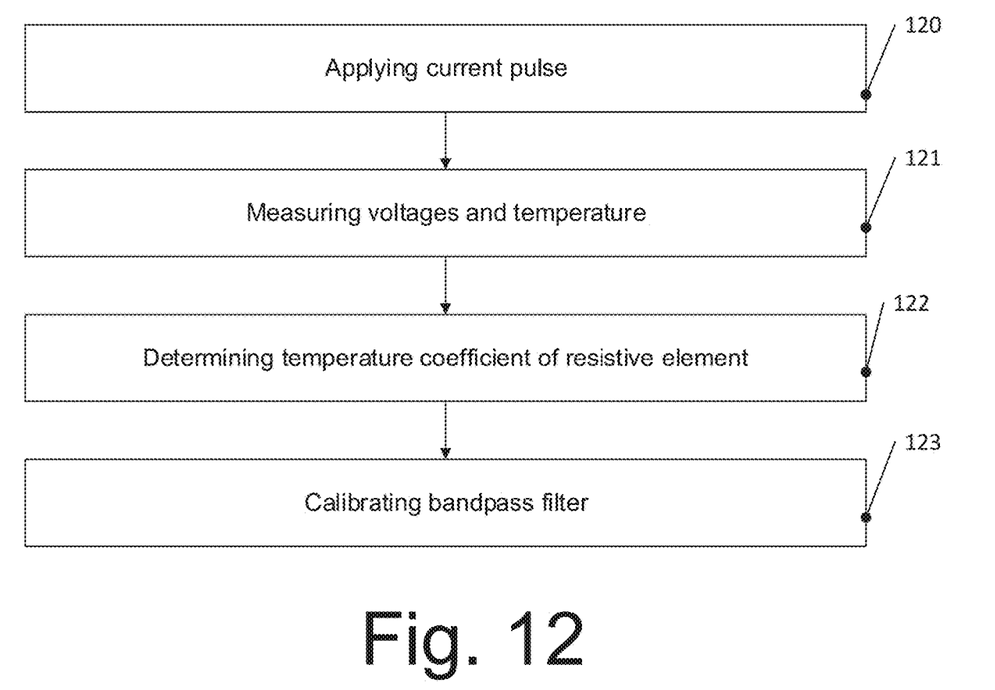
FIG. 12 is a flow chart illustrating a calibration method according to an embodiment.
Figure 13:
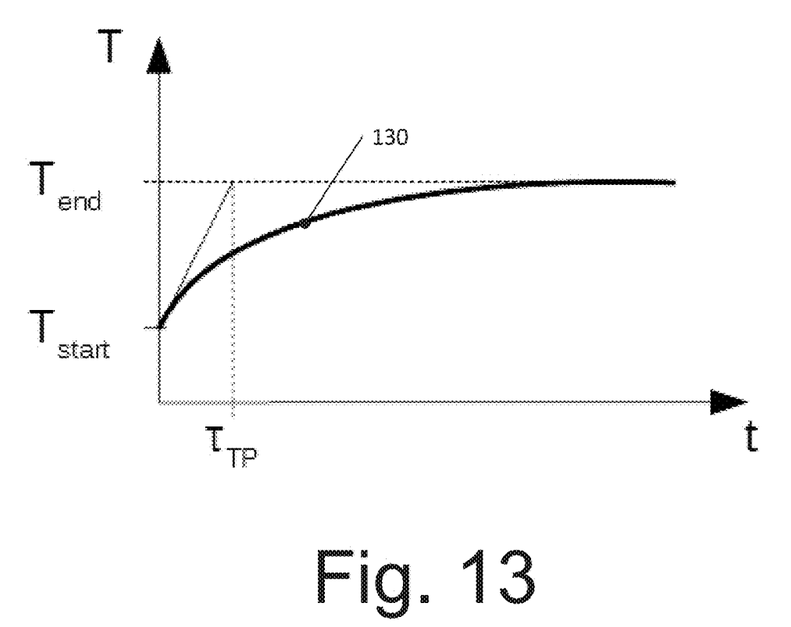
FIG. 13 is a diagram illustrating part of the calibration method of FIG. 12.

At 120 in FIG. 12, a current pulse with a known current I is sent though the resistive element.

At 121, at the start of the pulse, a temperature $T_1$ is measured by the temperature sensor (corresponding to value $T_{NTC}$ in the above embodiments), and the voltage across the shunt $V_{shunt}(T_1)$ is measured. At the start of the pulse, no substantive heating has taken place. Further at 121, after a certain time while the current pulse is still applied, another temperature $T_2$ is measured using the temperature sensor, and a corresponding voltage $V_{shunt}(T_2)$ is measured. The certain time is set long enough that the temperature has increased and reached a stable state. In such a stable state, the heating provided by the current is balanced by the heat dissipation, for example via a printed circuit board, and the temperature sensor has also reached a stable state. In particular, this certain time is longer than the time constant of the low-pass filter behavior of the current sensor and also longer than the temperature sensor time constant.

At 123, the method comprises determining the temperature coefficient $\alpha$ and other parameters.

$T_{ref}$ of equations (1) and (2) is defined as $$T_{ref} = T1 \quad (3)$$

Therefore, the above equation (3) may be simplified to $$\frac{R_{shunt}(T_1)}{R_{nom}} = \frac{R_{shunt}(T_{ref})}{R_{nom}} \quad (4)$$

From FIG. 8, the following relationship is apparent $$\frac{R_{shunt}(T)}{R_{nom}} = \frac{V_{shunt}(T)}{V_{nom}} \quad (5)$$

Therefore, using $$\frac{R_{shunt}(T)}{R_{nom}} = \frac{V_{shunt}(T)}{V_{nom}} = \frac{V_{shunt}(T)}{I \cdot R_{nom}} \quad (6)$$

for $T=T_1=T_{ref}$, $R_{shunt}(T_{ref})$ may be calculated according to $V_{shunt}(T_1)/I$, where I is the known current during the pulse.

If now $1_2$ and $V_{shunt}(T_2)$ are inserted in two equations (2) and (6), by combining both equations (2) and (6) $\alpha$ may be determined. Therefore, at 122 all parameters $\alpha$, $R_{shunt}(T_{ref})$ and $T_{ref}$ have been determined.

Next, at 123 of FIG. 12 the band-pass filter is calibrated.
In embodiments, the following parameters are determined:

$A_0$: gain (amplification) in the pass band of the band-pass filter

ILP: time constant for the low-pass behavior corresponding to the upper corner frequency $1/(2\pi\tau_{LP})$ and corresponding to the thermal time constant of the resistive element as explained with reference to FIGS. 3A and 3B $\tau_{HP}$: time constant for the high-pass part corresponding to the lower corner frequency $1/(2\pi96_{HP})$ of the band-pass filter and corresponding to the thermal time constant of the temperature sensor The gain $A_0$ is given by:

$$A_0 = \frac{1}{R_{shunt}(T)} \approx \frac{1}{R_{nom}} \quad (7)$$

In many cases, the approximation of $A_0$ by $1/R_{nom}$ is a sufficient approximation. It should be noted that a way to "circumvent" this approximation is the embodiment discussed with reference to FIG. 9, where a correction is applied between the squaring of the input voltage in block 41 and the band-pass filter 70, such that here setting $A_0$ to $1/R_{nom}$ is not an approximation.

The thermal time constant of the shunt $\tau_{LP}$ may be determined by measurement at 123. For this measurement, a pulse with constant power is applied to the shunt (i.e. the product of voltage and current remains constant), and the voltage across the shunt and the current is measured over time. From this, the resistance $R_{shunt}$ may be calculated over time. Using equation (1) and the parameters $R_{shunt}(T_{ref})$ $T_{ref}$ and $\alpha$ determined at 122 of FIG. 12, the temperature may be calculated over time. A curve 130 in FIG. 13 shows an example temperature over time for such a measurement. From this curve, $T_{LP}$ may be determined as shown in FIG. 13, where $T_{start}$ is the temperature at the beginning of the applied power and $T_{end}$ is the end temperature. $\tau_{LP}$ is at a point where a tangent to curve 130 at time 0 and $T=T_{start}$ crosses the end temperature $T_{end}$.

The thermal time constant of the current sensor $\tau_{HP}$ usually is specified in the data sheet of the temperature sensor.

In an alternative embodiment, the parameters of the band-pass filter may be determined at 123 in a different manner. In this alternative embodiment, the temperature measured by the temperature sensor and the voltage across the shunt $V_{shunt}(T)$ are not only measured at two times at 121, but are measured at a plurality of points in time, for example essentially continuously, while the current pulse is applied at 120. From the known current I applied during the current pulse and the measured signal $V_{shunt}(T)$ over time, the temporal behavior of the resistance $R_{shunt}(T)$ may be determined by dividing the voltage $V_{shunt}(T)$ by the current. Using equation (1) and the parameters $R_{shunt}(T_{ref})$, $T_{ref}$ and $\alpha$ the temperature $T_{shunt}$ may be determined over time. The difference between this temperature behavior $T_{shunt}$ and the temperature actually measured by the temperature sensor over time gives the ideal behavior of ΔT over time which ideally is output by the band-pass filter when the band-pass filter receives the corresponding voltage $V_{shunt}^2$ (note: $V_{shunt}=I*R_{nom}$ as seen from FIG. 8). Therefore, by this measurement both an input signal and a corresponding output signal for the band-pass filter is known. The parameters of the band-pass may then be determined by conventional means via a fitting process or using Fourier or Laplace transforms. This method is for example also applicable to band-pass filters of a higher order which may comprise several time constants both for the resistive element and for the temperature sensor.

Some embodiments are defined by the following examples.

Example 1. A current measurement device, comprising:
a voltage measurement circuit configured to measure a voltage across a resistive element, and
a correction circuit configured to:
generate an output signal indicative of a current through the resistive element based on the voltage across the resistive element,
estimate an indication of a temperature change of the resistive element based on the voltage across the resistive element, and
correct the output signal indicative of the current through the resistive element based on the indication of the temperature change and a measured temperature of the resistive element.

Example 2. The current measurement device of example 1, further comprising a temperature sensor thermally coupled to the resistive element and configured to measure the measured temperature of the resistive element.

Example 3. The current measurement device of example 1 or 2, wherein the correction circuit is configured to estimate an actual temperature of the resistive element based on the measured temperature of the resistive element and the indication of the temperature change, and to correct the output signal based on the estimated actual temperature of the resistive element.

Example 4. The current measurement device of any one of examples 1 to 3, wherein the correction circuit is configured to correct the output signal based on a temperature coefficient of the resistive element.

Example 5. The current measurement device of any one of examples 1 to 4, wherein the correction circuit is configured to estimate the indication of the temperature change based on a polynomial, for example a square, of the voltage across the resistive element.

Example 6. The current measurement device of example 5, wherein the correction circuit comprises a low-pass filter configured to low-pass filter the polynomial of the voltage across the resistive element.

Example 7. The current measurement device of any one of examples 1 to 6, wherein, for estimating the indication of the temperature change, the correction circuit comprises a high-pass filter with a corner frequency matching a corner frequency of a low-pass behavior of a temperature measurement of the measured temperature of the resistive element, wherein the high-pass filter is configured to filter a signal generated based on the voltage across the resistive element. The signal may for example be a signal based on the polynomial mentioned above, and/or an output signal of the low-pass filter of example 6.

Example 8. The current measurement device of example 6 and of example 7, wherein the high-pass filter and the low-pass filter are combined in a band-pass filter.

Example 9. The current measurement device of any one of examples 1 to 8, further comprising an analog-to-digital converter configured to digitize the voltage across the resistive element,
wherein the correction circuit is configured to estimate the indication of the temperature change based on the digitized voltage.

Example 10. The current measurement device of any one of examples 1 to 9, wherein the correction circuit is configured to estimate the indication of the temperature change based on a thermal model of the resistive element.

Example 11. The current measurement of any one of examples 1 to 10,
further comprising the resistive element.

Example 12. A current measurement method, comprising:
measuring a voltage across a resistive element, generating an output signal indicative of a current through the resistive element based on the voltage across the resistive element,
measuring a temperature of the resistive element,
estimating an indication of a temperature change of the resistive element based on the voltage across the resistive element, and
correcting the output signal based on the indication of the temperature change and the measured temperature of the resistive element.

Example 13. The current measurement method of example 12, wherein measuring the temperature of the resistive element comprises measuring the temperature of the resistive element by a temperature sensor thermally coupled to the resistive element.

Example 14. The current measurement method of example 12 or 13, wherein correcting the output signal comprises: estimating an actual temperature of the resistive element based on the measured temperature of the resistive element and the indication of the temperature change, and correcting the output signal based on the estimated actual temperature of the resistive element.

Example 15. The current measurement method of any one of examples 12 to 14, wherein correcting the output signal comprises correcting the output signal based on a temperature coefficient of the resistive element.

Example 16. The current measurement method of any one of examples 12 to 15, wherein estimating the indication of the temperature change comprises estimating the indication of the temperature change based on a polynomial, e.g. a square, of the voltage across the resistive element.

Example 17. The current measurement method of example 16, wherein estimating the indication of the temperature change comprises low-pass filtering the polynomial of the voltage across the resistive element.

Example 18. The current measurement method of any one of examples 12 to 17, wherein estimating the indication of the temperature change comprises high-pass filtering a signal generated based on the voltage across the resistive element with a corner frequency matching a corner frequency of a low-pass behavior of the measuring the temperature of the resistive element. The signal may for example be a signal based on the polynomial mentioned above, and/or an output signal of the low-pass filtering of example 17.

Example 19. The current measurement method of example 17 and of example 18, wherein the high-pass filtering and the low-pass filtering are combined in a band-pass filtering.

Example 20. The current measurement method of any one of examples 12 to 19, further comprising digitizing the voltage across the resistive element, wherein estimating the indication of the temperature change is based on the digitized voltage across the resistive element.

Example 21. The current measurement method of any one of examples 12 to 20, wherein estimating the indication of the temperature change is based on a thermal model of the resistive element.

Example 22. A method for calibrating the current measurement device of any one of examples 1 to 11, comprising:
applying a current pulse to the resistive element of the current measurement device,
measuring a first temperature and a first voltage across the resistive element at a beginning of the current pulse,
measuring a second temperature and a second voltage before the end of the current pulse, and
determining a temperature dependence of a resistance of the resistive element based on the first temperature, the first voltage, the second temperature and the second voltage.

Example 23. The method of example 22, wherein the current measurement device is implemented according to any one of examples 6 to 8, and wherein a gain of the low-pass filter, the high-pass filter and/or the band-pass filter is set to the inverse of a nominal resistance of the resistive element.

Example 24. The method of example 22,
wherein the current measurement device is implemented according to any one of examples 6 to 8,
wherein a gain of the low-pass filter, the high-pass filter and/or the band-pass filter is determined based on a temporal behavior of a measured temperature and a measured voltage across the resistive element during the current pulse.

Example 25. The method of example 23 or 24, further comprising determining the corner frequency of the low-pass filter or a lower corner frequency of the band-pass filter based on a thermal time constant of the resistive element.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A current measurement device comprising:
a voltage measurement circuit configured to measure a voltage across a resistive element, and
a correction circuit configured to:
generate an output signal indicative of a current through the resistive element based on the voltage across the resistive element,
estimate an indication of a dynamic temperature change of the resistive element based on a polynomial of the voltage across the resistive element, and
correct the output signal indicative of the current through the resistive element based on the indication of the dynamic temperature change and a measured static temperature of the resistive element.

2. The current measurement device of claim 1, wherein the correction circuit comprises a high-pass filter configured to filter a signal generated based on the polynomial of the voltage across the resistive element to estimate the indication of the dynamic temperature change.

3. The current measurement device of claim 2, wherein the high-pass filter has a corner frequency matching a corner frequency of a low-pass behavior of a temperature measurement of the measured static temperature of the resistive element.

4. The current measurement device of claim 1, further comprising a temperature sensor thermally coupled to the resistive element and configured to measure the measured static temperature of the resistive element.

5. The current measurement device of claim 1, wherein the correction circuit is configured to estimate an actual temperature of the resistive element based on the measured static temperature of the resistive element and the indication of the dynamic temperature change, and to correct the output signal based on the estimated actual temperature of the resistive element.

6. The current measurement device of claim 1, wherein the correction circuit is configured to correct the output signal based on a temperature coefficient of the resistive element.

7. The current measurement device of claim 1, wherein the correction circuit comprises a low-pass filter configured to low-pass filter the polynomial of the voltage across the resistive element.

8. The current measurement device of claim 1, further comprising an analog-to-digital converter configured to digitize the polynomial of the voltage across the resistive element, wherein the correction circuit is configured to estimate the indication of the dynamic temperature change based on the digitized voltage.

9. A current measurement method comprising:
measuring a voltage across a resistive element,
generating an output signal indicative of a current through the resistive element based on the voltage across the resistive element,
measuring a measured static temperature of the resistive element,
estimating an indication of a dynamic temperature change of the resistive element based on a polynomial of the voltage across the resistive element, and
correcting the output signal based on the indication of the dynamic temperature change and the measured static temperature of the resistive element.

10. The current measurement method of claim 9, wherein estimating the indication of the dynamic temperature change comprises high-pass filtering a signal generated based on the polynomial of the voltage across the resistive element.

11. The current measurement method of claim 10, wherein the high-pass filtering uses a corner frequency matching a corner frequency of a low-pass behavior of the measuring the temperature of the resistive element.

12. The current measurement method of claim 9, wherein measuring the temperature of the resistive element comprises measuring the temperature of the resistive element by a temperature sensor thermally coupled to the resistive element.

13. The current measurement method of claim 9, wherein correcting the output signal comprises: estimating an actual temperature of the resistive element based on the measured temperature of the resistive element and the indication of the dynamic temperature change, and
correcting the output signal based on the estimated actual temperature of the resistive element.

14. The current measurement method of claim 9, wherein correcting the output signal comprises correcting the output signal based on a temperature coefficient of the resistive element.

15. The current measurement method of claim 9, wherein estimating the indication of the dynamic temperature change comprises low-pass filtering the polynomial of the voltage across the resistive element.

16. A method for calibrating a current measurement device comprising a voltage measurement circuit configured to measure a voltage across a resistive element, and a correction circuit configured to:
- generate an output signal indicative of a current through the resistive element based on the voltage across the resistive element,
- estimate an indication of a dynamic temperature change of the resistive element based on the voltage across the resistive element, and
- correct the output signal indicative of the current through the resistive element based on the indication of the dynamic temperature change and a measured static temperature of the resistive element, the method comprising:
- applying a current pulse to the resistive element of the current measurement device, measuring a first temperature and a first voltage across the resistive element at a beginning of the current pulse,
- measuring a second temperature and a second voltage before the end of the current pulse, and
- determining a temperature dependence of a resistance of the resistive element based on the first temperature, the first voltage, the second temperature and the second voltage.

17. The method of claim 16, wherein the correction circuit comprises a high-pass filter configured to filter a signal generated based on the voltage across the resistive element.

18. The method of claim 16, wherein the correction circuit comprises a low-pass filter configured to low-pass filter the polynomial of the voltage across the resistive element.

19. A current measurement device comprising:
- a voltage measurement circuit configured to measure a voltage across a resistive element, and
- a correction circuit configured to:
  - generate an output signal indicative of a current through the resistive element based on the voltage across the resistive element,
  - estimate an indication of a dynamic temperature change of the resistive element based on the voltage across the resistive element, and
  - correct the output signal indicative of the current through the resistive element based on the indication of the dynamic temperature change and a measured static temperature of the resistive element, wherein the correction circuit comprises a high-pass filter configured to filter a signal generated based on the voltage across the resistive element to estimate the indication of the dynamic temperature change, and wherein the high-pass filter has a corner frequency matching a corner frequency of a low-pass behavior of a temperature measurement of the measured static temperature of the resistive element.

20. A current measurement method comprising:
measuring a voltage across a resistive element,
generating an output signal indicative of a current through the resistive element based on the voltage across the resistive element,
measuring a measured static temperature of the resistive element,
estimating an indication of a dynamic temperature change of the resistive element based on the voltage across the resistive element, wherein estimating the indication of the dynamic temperature change comprises high-pass filtering a signal generated based on the voltage across the resistive element, and wherein the high-pass filtering uses a corner frequency matching a corner frequency of a low-pass behavior of the measuring the temperature of the resistive element, and
correcting the output signal based on the indication of the dynamic temperature change and the measured static temperature of the resistive element.

* * * * *